US006657836B2

United States Patent
He et al.

(10) Patent No.: US 6,657,836 B2
(45) Date of Patent: Dec. 2, 2003

(54) POLARITY REVERSAL TOLERANT ELECTRICAL CIRCUIT FOR ESD PROTECTION

(75) Inventors: Qing He, Gilbert, AZ (US); DC Sessions, Phoenix, AZ (US)

(73) Assignee: Koninklijke Philips Electronics N.V., Eindhoven (NL)

(*) Notice: Subject to any disclaimer, the term of this patent is extended or adjusted under 35 U.S.C. 154(b) by 142 days.

(21) Appl. No.: 10/022,990

(22) Filed: Dec. 18, 2001

(65) Prior Publication Data

US 2003/0112565 A1 Jun. 19, 2003

(51) Int. Cl.[7] ............................................... H02H 9/00
(52) U.S. Cl. ............................. 361/56; 361/82; 361/84; 361/111; 307/127
(58) Field of Search ........................... 361/54, 56, 77, 361/78, 82, 84, 86, 90, 91.1, 111; 307/127; 323/299, 304, 311, 349

(56) References Cited

U.S. PATENT DOCUMENTS

| | | |
|---|---|---|
| 5,321,293 A | 6/1994 | Mojaradi et al. |
| 5,416,351 A | 5/1995 | Ito et al. |
| 5,528,064 A | 6/1996 | Thiel et al. |
| 5,593,911 A | 1/1997 | Lee et al. |
| 5,637,900 A | 6/1997 | Ker et al. |
| 5,721,439 A | 2/1998 | Lin |
| RE36,024 E | 1/1999 | Ho et al. |
| 5,930,094 A | 7/1999 | Amerasekera et al. |
| 5,969,923 A | 10/1999 | Avery |
| 6,008,970 A | 12/1999 | Maloney et al. |
| 6,025,746 A | 2/2000 | So |
| 6,153,913 A | 11/2000 | Hsu et al. |
| 6,218,706 B1 | 4/2001 | Waggoner et al. |
| 6,249,410 B1 * | 6/2001 | Ker et al. ...................... 361/56 |
| 6,347,026 B1 * | 2/2002 | Sung et al. ................... 361/56 |
| 6,512,662 B1 * | 1/2003 | Wang ........................... 361/56 |
| 6,529,356 B2 * | 3/2003 | Chin et al. ................... 361/56 |
| 6,569,740 B1 * | 5/2003 | Smith ........................... 438/279 |

* cited by examiner

Primary Examiner—Michael Sherry
Assistant Examiner—Gary L. Laxton
(74) Attorney, Agent, or Firm—Peter Zawilski

(57) ABSTRACT

An ESD protection circuit is provided which offers full protection for sub micron CMOS technology integrated circuits that does not have a latchup problem as in silicon controller rectifier circuits. The primary ESD protection transistor within the circuit channeling deleterious ESD currents away from the electrical circuit using snapback conduction while additionally enabling bipolar operation of the electrical circuit.

22 Claims, 2 Drawing Sheets

POLARITY REVERSAL TOLERANT ELECTRICAL CIRCUIT FOR ESD PROTECTION

FIELD OF THE INVENTION

This invention relates to over voltage protection of electrical circuits and more specifically to the area of protecting electrical circuits from an electrostatic discharge (ESD) over voltage while tolerating a reverse polarity condition applied to the electrical circuit input terminals.

BACKGROUND OF THE INVENTION

A common cause of failure in electronic integrated circuits (ICs) is due to a sudden exposure to a large over voltage condition known as electrostatic discharge (ESD). In manufacturing the ICs or while using these ICs to assemble a product they are susceptible to ESD. Electrostatic charge build up typically results from contact and later removal of dissimilar materials from one another and ESD results from the flow of this charge.

When a charged item comes in contact with an IC, especially when a portion of the IC is grounded, the electrical charge very quickly discharges by traveling through the IC to ground. ESD voltages during an ESD discharge event range as high as 2 KVolts, jumping air gaps of over a mm in length. In current CMOS technology, gaps between conductors and various components within the IC are in the order of sub microns. The advantages seen by improving performance characteristics of ICs, such as speed and lower operating voltages, are offset by increased sensitivity to ESD. These smaller and more efficient chip sizes, have much smaller electrical bus conductors and as a result can be easily damaged. In these ICs MOS transistor gate oxides are more fragile and have much lower breakdown voltages. Prior to sub micron technology utilized for manufacturing of ICs the larger chips had more capacitance with more area for charge storage, and as a result were not as susceptible to ESD related damage; having smaller IC features results in a higher potential for ESD related problems.

These smaller conductors and components within the ICs have a very limited current carrying capacity, and often times the ESD result in the conductors and components acting like fuses, thereby blowing, or shorting, or melting the conductors and components within the integrated circuit, rendering the electrical circuit damaged and more likely useless. Components manufactured from oxides and other films within MOS devices are unlikely to withstand high dielectric breakdown conditions since a high level of current flows through very small cross sectional areas of the circuit. This resistive heating in elements like diodes, transistors and resistors melts conductive material such as polysilicon or aluminum. This molten material within the circuit flows along the electric field lines creating short circuits within the IC. ESD for instance causes short circuits between source and drain in MOSFET devices, or reverse breakdown of p-n junctions in transistors or diodes. In most cases these short circuits remain after the ESD event has completed and likely renders the electrical circuit useless for its designated purpose.

Generally, MOS type integrated circuits are prone to ESD damage if their input and output pins are left unprotected, especially during handling of the integrated circuit. As a result a common IC design industry practice is to place some form of ESD protection within the IC such that these deleterious currents do not flow through sensitive paths. Typically the built-in ESD protection devices take the form of additional circuits placed between the input pins, output pins and supply voltage rails.

Common methods of providing ESD protection to ICs include using diodes, such as Zener diodes for CMOS circuits. The applied ESD energy then dissipates through the diode by avalanche breakdown or punch through creating a low resistance path to ground, channeling the deleterious electrical potential to ground, thereby offering protection to the IC.

In U.S. Pat. No. 5,416,351 to Ito et al. is disclosed an ESD protection circuit to coupled NMOS and PMOS devices by using a Zener region formed in the drain to assist in NMOS and PMOS diode breakdown, and in U.S. Pat. No. 5,528,064 to Thiel et al is disclosed ESD protection for MOS devices by using back-to-back Zener diodes. Using back-to-back diodes provide some ESD protection but unfortunately allows too much voltage to pass within new generation MOS devices that are made with thinner gate oxides in sub micron CMOS devices.

An alternate technique for ESD protection is disclosed in U.S. Pat. No. 6,233,130 by Lin. This technique utilizes a transient high-voltage pumping circuit for pumping the ESD voltage to a higher voltage during an ESD event for early triggering of the SCR (silicon-controlled rectifiers) during an ESD event. SCRs provide adequate protection but are not desirable on power busses due to their tendency to latchup. Latchup occurs when the input signals are outside a predefined voltage range. When latchup occurs, a channel substrate diode within the SCR become conducting and floods the substrate with charge carriers.

In U.S. Pat. No. 5,959,820, Ker, et al. disclose removal of the latchup condition by providing a holding voltage on the low voltage trigger SCR (LVTSCR) which is greater than the supply voltage on the IC. Increasing the holding voltage on the LVTSCR is accomplished by providing double guard rings surrounding both the anode and the cathode of a LVTSCR device. The guarding structure breaks the latching path and increases the holding voltage of the LVTSCR. However increasing the holding voltage of an LVTSCR leads to more power dissipation at the LVTSCR during an ESD transition and using a double guard rings results in a lower ESD robustness of the LVTSCR. Furthermore guard rings occupy more layout spacing on the IC die and are therefore costly.

It is therefore an object of the present invention to provide an ESD protection circuit which provides substantial protection for sub micron CMOS technology integrated circuits.

It is another the object of the present invention to provide ESD protection without latchup problems in the ESD protection circuit, while offering bipolar ESD protection circuit operation.

SUMMARY OF THE INVENTION

In accordance with the invention there is provided an ESD protection circuit comprising:
   a first voltage input port;
   a second voltage input port;
   an ESD protection circuit including a primary transistor comprising a first port a second port and a control port for controlling current flow between the first port and the second port, the first port and the second port coupled electrically between the first voltage input port and the second voltage input port; and,
   a polarity independent control circuit for providing a same voltage at the control port of the primary transistor within the ESD protection circuit regardless of the polarity of the voltage applied across the first voltage input port and the second voltage input port.

In accordance with another aspect of the invention there is provided an ESD protection circuit comprising:

a first voltage input port;

a second voltage input port;

a common bulk node;

a primary ESD protection transistor having a first port coupled to the second voltage input port, a second port coupled to the second voltage input port, and a control port coupled to the common bulk node for controlling current flow between the first port and the second port;

a secondary ESD protection transistor having a first port electrically coupled to the second voltage input port, a second port coupled to the first voltage input port, and a control port coupled to the common bulk node for controlling current flow between the first port and the second port;

a forward bias transistor having a first port electrically coupled to the second voltage input port, a second port coupled to the common bulk, and a control port electrically coupled to the first voltage input port for controlling current flow between the first port and the second port; and a reverse bias transistor having a first port coupled to the common bulk node a second port coupled to the first voltage input port and a control port electrically coupled to the first port of the forward bias transistor for controlling current flow between the first port and the second port, wherein the primary, secondary, forward bias, and reverse bias transistors share the same common bulk node.

In accordance with yet another aspect of the invention there is provided A method of offering ESD protection comprising the steps of:

provide a control circuit for providing a voltage output within a known range in response to an applied voltage potential independent of the voltage potential polarity;

coupling a power source across a primary ESD protection transistor having a minimum holding voltage, the ESD protection transistor having a control port for receiving the voltage output;

when an ESD event transient voltage above the minimum holding voltage occurs, performing snapback conduction on the primary ESD protection transistor, wherein the ESD event transient voltage being above the ESD protection transistor holding voltage enables snapback current to flow through the primary ESD protection transistor.

BRIEF DESCRIPTION OF THE DRAWINGS

The invention will now be described with reference to the drawings in which.

DETAILED DESCRIPTION OF THE INVENTION

Figure 1:
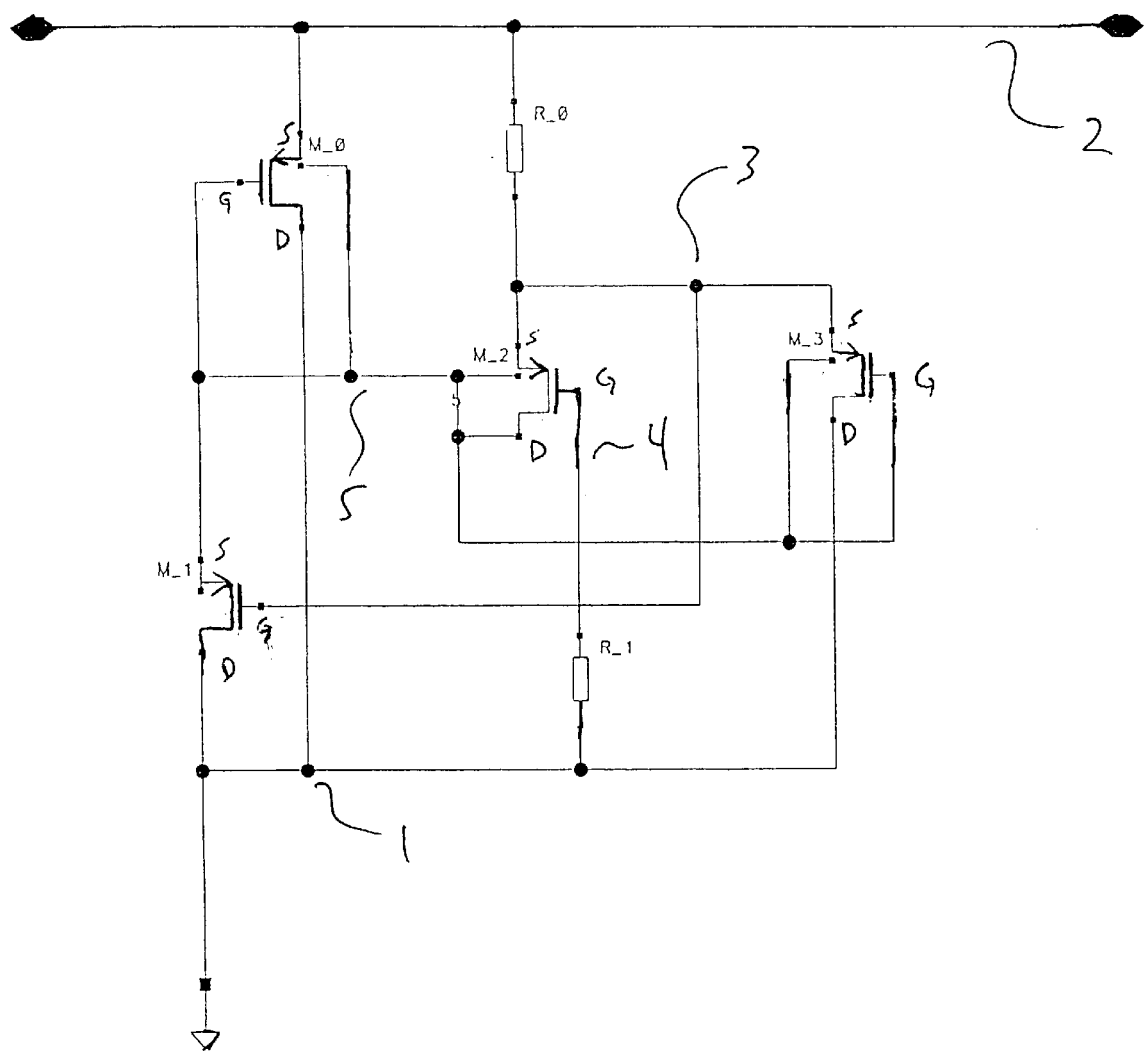
FIG. 1 is a diagram of the preferred embodiment illustrating a MOS ESD protection circuit capable of reverse polarity operation.

In FIG. 1, a preferred embodiment of present invention is shown. The circuit will be described with reference to two modes of operation, forward bias and reverse bias. In this circuit under forward biased operation, node 2 is a positive input pin with respect to node 1 which is grounded. Under reverse bias operation node 1 is a positive input pin with respect to node 2, which is grounded. Transistor M0 is a large ESD-protection P channel MOS device. Transistors M1, M2, and M3 are also P channel MOS devices and are utilized for the two modes of circuit operation and will be discussed in detail below. The bulk of all transistors, M0, M1, M2, M3 in the circuit share a common bulk, isolated from ground.

In normal operation where no ESD event is present on either of the input pins 1, 2 transistor M0 is OFF and nonconductive. In order for transistor M0 to remain nonconductive, its gate and bulk 5 are maintained at a potential that is at least as positive as its source 2 and drain 1.

Forward Bias Operation

In forward biased operation node 2 is positive relative to node 1. Transistors M0, M1, and M3 are OFF, and transistor M2 is ON. The terms ON and OFF relating to transistors are commonly used terms referring to a state of conductivity of the transistor. Transistors having a sufficiently inverted channel region therein are generally referred to as ON since they conduct from source to drain. The bulk 5 of all transistors is as positive as node 2, and only leakage currents flow through the circuit. This current electrical state is the result of the operation of transistor M2. When node 2 is positive, node 3 electrically connected to node 2 through resistor R0 is also positive. The high potential on node 3 ensures that M1 is OFF. The gate of M2 is grounded through the circuit and as a result M2 is turned ON, connecting node 5 to node 3. Since node 5 is as positive as node 3, M3 is also OFF. With no path to ground through M1 or M3, node 3 rises to equal the potential of node 2, and node 5 follows. Having the gate and body 5 of M0 as positive as node 2, M0 is OFF and only leakage current flows.

Reverse Bias Operation

In reverse biased operation node 1 is positive relative to node 2. Transistors M0, M2. and M3 are OFF and M1 is ON. The bulk of these transistors 5 is positive, as node 1, and only leakage currents flow. This current electrical state is the result of the operation of transistor M1. When node 2 is negative relative to node 1, node 3 is pulled negative through resistor R0. In transistor M1 the gate 3 is more negative than its drain and therefore M1 is ON and node 5 is at approximately a same potential as node 1. Transistors M2 and M3 are OFF, since their drains, bulks and gates more positive than their sources, preventing current from flowing through R0. M0 is OFF since its drain, bulk and gate are more positive than its source.

ESD Protection

In the electrical circuit illustrated in the preferred embodiment protection is offered to CMOS ICs against electrostatic discharge (ESD) while tolerating the reversal of polarity on the input pins 1 and 2.

Transistors M0 and M3 are OFF regardless of the input polarity applied to the input pins. Only leakage currents flows through resistors R0 and R1, so nodes 3 is nearly equal in potential to node 2 and node 4 is nearly equal in potential to node 1. In normal, non ESD event, operation transistors M0 and M3 are normally OFF and therefore no voltage drop is developed across R0 and R1.

When an ESD event occurs, transistor M0 is the primary ESD protection device. In an ESD event the current rise time is extremely abrupt and the gate oxides of the non-protection transistors need to be protected even from the ESD event. Under an ESD event the transistor M0 goes into snapback conduction, absorbing the energy of the transient ESD event.

Figure 2:
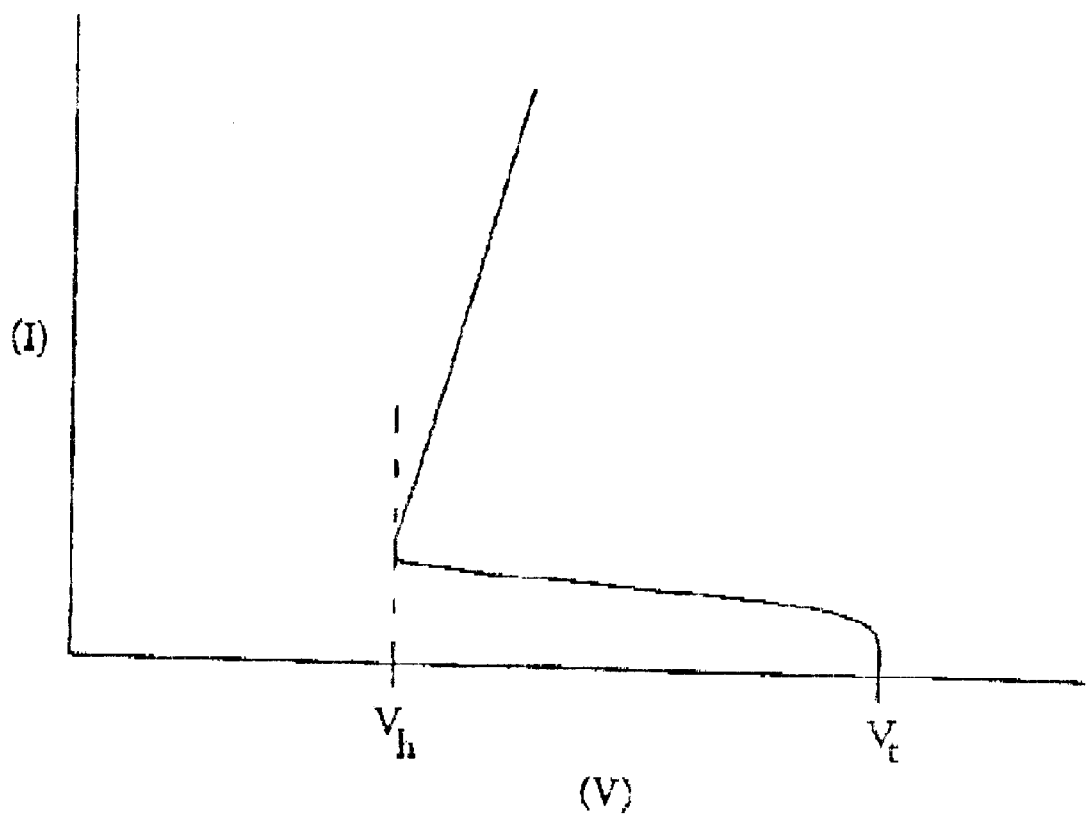
FIG. 2 is a Prior Art current voltage plot showing the relationship therebetween during an ESD event.

Referring now to Prior Art FIG. 2, a current (I) versus voltage (V) graph for a transistor in snapback conduction shows that no current flows between source and drain of the device until the ESD event transient voltage has reached the trigger voltage ($V_t$) of the transistor M0. Once $V_t$ has been reached and snapback conduction is initiated current increases and the potential difference present between the source and drain of the transistor decreases. As long as the ESD event transient voltage is above the transistor holding voltage $V_h$ then snapback current continues to flow through the protection device. Resulting in an increased voltage above $V_h$ after snapback conduction has occurred and thereby providing a large increases in current. This large increase in current is shown in the steep upward slope of the graph above the inflection point occurring at $V_h$. Resistors R0 and R1 help to limit the ESD event transient current. Transistor M3, located between nodes 3 and 1 absorbs this reduced transient ESD event transient current resulting in protection provided to transistors M1 and M2. Resistors R0 and R1 and transistors M0 and M3 serve to provide a charged device model protection network.

Advantageously this type of ESD event transient protection circuit protects transistors M1 and M2 while allowing for reverse bias operation of the circuit. In reverse biased operation the rest of the circuit may not function as designed, however because the ESD protection circuit allows for reverse biased operation the electrical circuit will not cause any harm when connected to a high current capacity power supply. If the circuit were not designed to operate in reverse bias then resistive heating may take place within and the internal components of the IC will melt. This resistive heating poses a great risk since the IC can catch fire and cause harm to equipment where it is installed resulting in costly repair to the damaged components.

Numerous other embodiments may be envisaged without departing from the spirit or scope of the invention.

What is claimed is:

1. An ESD protection circuit comprising:
   a first voltage input port;
   a second voltage input port;
   an ESD protection circuit including a primary transistor comprising a first port a second port and a control port for controlling current flow between the first port and the second port, the first port and the second port coupled electrically between the first voltage input port and the second voltage input port; and,
   a polarity independent control circuit for providing a same voltage at the control port of the primary transistor within the ESD protection circuit for either of the polarities of the voltage applied across the first voltage input port and the second voltage input port.

2. An ESD protection circuit as defined in claim 1 wherein the ESD protection circuit includes a second transistor comprising a first port a second port and a control port for controlling current flow between the first port and the second port, the first port and the second port coupled electrically between the second voltage input port and the first voltage input port.

3. An ESD protection circuit as defined in claim 2 wherein the polarity independent control circuit is electrically coupled for providing a same voltage at the control port of the second transistor within the ESD protection circuit regardless of the polarity of the voltage applied across the first voltage input port and the second voltage input port.

4. An ESD protection circuit as defined in claim 3 wherein a current limiting circuit is provided within the ESD protection circuit.

5. An ESD protection circuit as defined in claim 4 wherein the current limiting circuit is in series with the second transistor between the first voltage input port and the second voltage input port.

6. An ESD protection circuit as defined in claim 1 wherein the primary transistor is a field effect transistor.

7. An ESD protection circuit as defined in claim 6 wherein the field effect transistor is P channel.

8. An ESD protection circuit as defined in claim 6 wherein the control port is the gate of the FET transistor, and the first port is the source of the FET transistor and second port is the drain of the FET transistor.

9. An ESD protection circuit as defined in claim 2 wherein the second transistor is a FET transistor and wherein the control port is the gate of the FET transistor, and the first port is the source of the FET transistor and second port is the drain of the FET transistor.

10. An ESD protection circuit as defined in claim 4 wherein the current limiting circuit includes a resistor.

11. An ESD protection circuit as defined in claim 1 wherein the first voltage input port is for being coupled to a ground potential and the second voltage input port is for being coupled to a voltage source at a higher potential than the ground potential.

12. An ESD protection circuit comprising:
    a first voltage input port;
    a second voltage input port;
    a common bulk node;
    a primary ESD protection transistor having a first port coupled to the second voltage input port, a second port coupled to the second voltage input port, and a control port coupled to the common bulk node for controlling current flow between the first port and the second port;
    a secondary ESD protection transistor having a first port electrically coupled to the second voltage input port, a second port coupled to the first voltage input port, and a control port coupled to the common bulk node for controlling current flow between the first port and the second port;
    a forward bias transistor having a first port electrically coupled to the second voltage input port, a second port coupled to the common bulk, and a control port electrically coupled to the first voltage input port for controlling current flow between the first port and the second port; and
    a reverse bias transistor having a first port coupled to the common bulk node a second port coupled to the first voltage input port and a control port electrically coupled to the first port of the forward bias transistor for controlling current flow between the first port and the second port, wherein the primary, secondary, forward bias, and reverse bias transistors share the same common bulk node.

13. An ESD protection circuit as defined in claim 12 comprising a current limiting circuit disposed electrically between the first voltage input port and the control port of the forward bias transistor.

14. An ESD protection circuit as defined in claim 13 comprising a second current limiting circuit disposed electrically between the second voltage input port and the first port of the forward bias transistor and between the second voltage input port and the first port of the secondary ESD protection transistor.

15. An ESD protection circuit as defined in claim 12 comprising a current limiting circuit disposed electrically between the second voltage input port and the first port of the forward bias transistor and between the second voltage input port and the first port of the secondary ESD protection transistor.

16. An ESD protection circuit as defined in claim 15 wherein the first port of the forward bias transistor is coupled to the first port of the secondary ESD protection transistor.

17. An ESD protection circuit as defined in claim 13 wherein the current limiting circuit comprises a resistor.

18. An ESD protection circuit as defined in claim 12 wherein the transistors are FET transistors.

19. An ESD protection circuit as defined in claim 18 wherein the FET transistors are P channel.

20. An ESD protection circuit as defined in claim 18 wherein for each transistor the control port is the gate of the FET transistor, and the first port is the source of the FET transistor and second port is the drain of the FET transistor.

21. A method of offering ESD protection comprising the steps of:

provide a control circuit for providing a voltage output within a known range in response to an applied voltage potential independent of the voltage potential polarity;

coupling a power source across a primary ESD protection transistor having a minimum holding voltage, the ESD protection transistor having a control port for receiving the voltage output;

when an ESD event transient voltage above the minimum holding voltage occurs, performing snapback conduction on the primary ESD protection transistor, wherein the ESD event transient voltage being above the ESD protection transistor holding voltage enables snapback current to flow through the primary ESD protection transistor.

22. A method according to claim 21 comprising the steps of:

providing a secondary ESD protection transistor;

channelling a portion of the snapback current through the secondary ESD protection transistor after conducting a majority of the snapback current through the primary ESD protection transistor.

* * * * *